United States Patent [19]

Toyama et al.

[11] Patent Number: 5,002,857
[45] Date of Patent: Mar. 26, 1991

[54] METHOD FOR MANUFACTURING LITHOGRAPHIC PRINTING PLATES

[75] Inventors: Tadao Toyama; Hiroshi Matsumoto; Kenji Kunichika, all of Shizuoka, Japan

[73] Assignee: Fuji Photo Film Co., Ltd., Minami-ashigara, Japan

[21] Appl. No.: 365,728

[22] Filed: Jun. 14, 1989

[30] Foreign Application Priority Data

Jun. 17, 1988 [JP] Japan ................ 63-149618

[51] Int. Cl.$^5$ ............................................. G03F 7/00
[52] U.S. Cl. ................................... 430/300; 354/324; 430/309; 430/310; 430/331
[58] Field of Search ............... 430/300, 309, 310, 331; 354/324

[56] References Cited

U.S. PATENT DOCUMENTS 4,291,117 9/1981 Ohishi ................................ 430/309
4,840,875 6/1989 Kunichika et al. ................ 430/331

Primary Examiner—Jack P. Brammer
Attorney, Agent, or Firm—Burns, Doane, Swecker & Mathis

[57] ABSTRACT

A method for manufacturing lithographic printing plates which comprises developing a presensitized plate for use in making lithographic printing plates imagewise opposed to light with an alkaline developer utilizing an automatic developing machine and then treating the developed presensitized plate with a finisher, wherein an initial pH of the finisher ranges from 2 to 8 and a pH of the finisher is controlled during running in proportion to concentration of the developer included in the finisher. The method makes it possible to prevent the formation of gel-like insoluble matters in the bath for treatment with the finisher due to the presence of the developer carried over from a developing bath and to stably process a large amount of lithographic printing plates over a long time period.

11 Claims, No Drawings

METHOD FOR MANUFACTURING LITHOGRAPHIC PRINTING PLATES

BACKGROUND OF THE INVENTION

The present invention relates to a method for manufacturing lithographic printing plates from presensitized plates for used in making lithographic printing plates (hereinafter referred to as "PS plates") and more particularly to a method for manufacturing lithographic printing plates by developing an imagewise exposed PS plate and then treating the plate with a finisher.

There has conventionally been known a method for manufacturing lithographic printing plates from PS plates which generally comprises developing the PS plate after imagewise exposing it to light and then treating the developed PS plate with a finisher such as a rinsing solution containing a surfactant or a protective gumming solution comprising a water-soluble resin, in order to save the amount of washing water used after development (see, for instance, Japanese Patent Unexamined Publication (hereunder referred to as "J. P. KOKAI") Nos. Sho 55-115045 (U.S. Pat. No. 4,291,117) and Sho 55-12921).

In addition, a method in which a developed PS plate is washed with washing water which is repeatedly utilized, is also known (see J. P. KOKAI No. 55-25027). After such a cyclic water washing process, the PS plate processed is then generally treated with the foregoing finisher.

Finishers are preferably acidic or neutral ones from the viewpoint of neutralizing an alkaline developer remaining on a lithographic printing plate during the plate-making process. However, if a part of such an alkaline developer is carried over to a bath containing a finisher during the plate-making process, gel-like insoluble matters are liable to be formed. This makes the maintenance and washing of an automatic developing machine and so forth inconvenient and complicated, and causes the clogging of a spray pipe; and the insoluble matters are adhered to lithographic printing plates as contaminants. For this reason, it is difficult to use a finisher for a long time period without exchanging the same.

The inventors of this invention have examined thoroughly to elongate the life span of a rinsing solution and already found that the rinsing solution can be stabilized by performing rinsing in a plurality of rinsing baths to gradually decrease the concentration of a developer while gradually reducing pH of the rinsing baths so that the later bath has a lower pH (see J. P. KOKAI No. Sho 63-172270).

This method makes it possible to greatly increase the time of forming gel-like substances in the rinsing solutions and to stably perform processing for a long time period. However, in the later rinsing baths, such gel-like substances ár gradually formed as the pH value of the rinsing baths reaches around 7 or more.

SUMMARY OF THE INVENTION

Accordingly, an object of the present invention is to provide a method for manufacturing lithographic printing plates which comprises developing an imagewise exposed PS plate and then treating the plate with a finisher and more specifically to a method for manufacturing lithographic printing plates which can prevent the formation of gel-like insoluble matters due to a developer carried over from a developing bath to a bath for treating the plate with a finisher and which makes it possible to produce a large number of lithographic printing plates over a long time period.

The inventors of this invention have conducted various studies to eliminate the foregoing disadvantages and, as a result, the present invention has been completed.

The present invention provides a method for manufacturing lithographic printing plates which comprises developing an imagewise exposed PS plate with an alkaline developer utilizing an automatic developing machine and then treating the developed PS plate with a finisher, wherein a pH of the finisher initially ranges from 2 to 8 and is controlled depending on a concentration of the developer contained in the finisher during running.

In the method of the present invention, it is preferred to control pH of the finisher during running by supplementing a certain amount of a fresh finisher.

The finisher used herein may be a rinsing solution containing a surfactant or a protective gumming solution containing water-soluble resins.

In the method of this invention, a water washing process may lie between the developing process and the treatment with a finisher.

According to a preferred embodiment of this invention, a pH of the finisher during running is controlled so as to fall within the following pH range defined by formula (I):

$$pH \geq 7 + [(C - 2.5)/1.5]^{\frac{1}{2}} \text{ or } pH \leq 7 - [(C - 2.5)/1.5]^{\frac{1}{2}} \quad (1)$$

In formula (I), C is the concentration (% by volume; C>2.5) of the developer contained in the finisher. The alkaline developer used in this case is preferably those containing 1 to 10% by weight of a silicate having a molar ratio, $SiO_2/M_2O$ (wherein M is an alkali metal or an ammonium residue), ranging from 0.3 to 3.0.

DETAILED EXPLANATION OF THE INVENTION

The method of this invention will hereunder be explained in more detail.

As automatic developing machines used in the present invention, preferred are those in which PS plates to be processed are automatically conveyed and which comprise a developing zone, a water washing zone, a rinsing zone, a gumming-up zone, a drying zone and the like. Particularly preferred are dip-developing types from the viewpoint of elongating the life span of a developer, but other automatic developing machines commonly known may also be utilized.

It is of primary importance in the present invention that the pH of a finisher should be controlled so as not to generate gel like substances in the finisher. The inventors of this invention have found that conditions which cause the generation of such gel-like substances in the finisher when a developer is carried over to the finisher are established by the concentration of the developer present in the finisher and the pH value of the finisher. More specifically, in the case of a developer containing a silicate, the gel-like substances are liable to be formed in the finisher when the developer is carried over in an amount of not less than 2% by volume and the pH of the finisher is held within a neutral range. Moreover, the inventors have found that the formation of such gel-like substances can be suppressed by controlling the pH of the finisher to not less than 7.6 or not more than 6.4 if the finisher contains about 3% by volume of the developer; to not less than 8.3 or not more than 5.7 if the finisher contains about 5.0% by volume; and to not less than 9.2 or not more than 4.8 if the finisher contains about 10% by volume of the developer.

In other words, the inventors have found that the gel-like substances are hard to be formed within the following pH range if the concentration of developer in the finisher is assumed to be C:

$$\text{pH} \geq 7 + [(C - 2.5)/1.5]^{\frac{1}{2}} \text{ or } \text{pH} \leq 7 - [(C - 2.5)/1.5]^{\frac{1}{2}} \quad (I)$$

The concentration of the developer in the finisher varies depending upon various factors such as the amount of the developer carried over from a developing bath to a bath for treatment with a finisher by a processed PS plate; the amount of the finisher initially charged; the amount of the finisher's components lost due to evaporation; the amount of the finisher carried over to the subsequent baths by the processed pS plate; and the amount of a replenisher for finisher supplemented. Moreover, the pH of a finisher also varies depending upon various factors such as the initial pH and the pH-buffering ability of the finisher; the amount of the developer carried over to the bath for finisher by the processed PS plate and its strength of alkali; and the pH value, the pH-buffering ability and the supplemented amount of a replenisher for finisher.

Thus, the initial pH of the finisher used herein ranges from 2 to 8 and preferably 2.5 to 7.5 whereby desensitizing properties of non-image areas of the resulting lithographic printing plates are highly improved. Particularly, if the pH of the finisher is controlled within the acidic range as described above, the initial pH thereof is preferably not more than 4.5.

The finishers used in the invention preferably comprise a proper amount of pH-buffering agents so that the pH which is influenced by an alkaline developer carried over to the finisher can be controlled so as to fall within the aforementioned range. Alternatively, the pH value may be controlled by supplementing a replenisher for finisher containing an appropriate amount of pH-buffering agents. The replenisher for finisher used for such a purpose may be the finisher per se, a solution having the same composition but having a rate of dilution different from that of the finisher and a solution having a formulation quite different from that of the finisher.

As the pH-buffering agents used in the finisher and replenishers therefore there may be used, for instance, either water soluble salts or acids or both of them. The pH-buffering agents are detailed in "KAGAKU BINRAN KISOHEN (Handbook of Chemistry, Fundamentals)", pp. 1312-1320, edited by Japan Chemical Society, 5th edition, Showa 47 (1972) Feb. 20, issued by Maruzen Publishing Co., Ltd. Any buffering agents per se listed therein may be used in the invention. Examples of preferred acids and water-soluble salts are such inorganic acids as molybdic acid, boric acid, nitric acid, sulfuric acid, phosphoric acid and polyphosphoric acid; such water-soluble organic acids as acetic acid, glycolic acid, oxalic acid, tartaric acid, benzoic acid, succinic acid, citric acid, malic acid, lactic acid and p-toluenesulfonic acid; and salts thereof. Examples of more preferred salts are water-soluble alkali metal salts and ammonium salts, particularly molybdates such as ammonium molybdate, phosphates such as sodium phosphate, polyphosphates such as sodium tetrapolyphosphate and sodium trimetaphosphate, oxalates such as sodium oxalate, tartrates such as potassium tartrate, succinates such as sodium succinate and citrates such as ammonium citrate. These acids and water-soluble salts may be used alone or in combination.

The amount of the acids and the salts to be added to the finishers is not critical, but is preferably not more than about 10% by weight and more preferably 0.01 to 6% by weight expressed in the total amount of the acids and salts based on the total weight of the aqueous solution as the finisher.

It is also preferred that a pH is controlled by supplementing a replenisher containing these acids and salts.

If the finisher as used herein is a rinsing solution containing a surfactant, it preferably comprises, in addition to the foregoing acids and salts serving as pH adjusting agents and as pH buffering agents, organic solvents, lipophilic substances, antiseptics, anti-fungus agents, anti-oxidants, dyes, anti-foaming agents and a small amount of water soluble resins.

Examples of surfactants which are principal component of the rinsing solution include such non-ionic surfactants as polyoxyethylene alkyl ethers, polyoxyethylene alkylphenyl ethers, polyoxyethylene polystyrylphenyl ethers, polyoxyethylene polyoxypropylene alkyl ethers, partial esters of glycerin fatty acids, partial esters of sorbitan fatty acids, partial esters of pentaerythritol fatty acids, propylene glycol monofatty acid esters, partial esters of succharose fatty acids, partial esters of polyoxyethylene sorbitan fatty acids, partial esters of polyoxyethylene sorbitol fatty acids, polyethylene glycol fatty acid esters, partial esters of polyglycerin fatty acids, castor oils modified with polyoxyethylene, partial esters of polyoxyethylene glycerin fatty acids, fatty acid diethanolamides, N,N-bis-2-hydroxyalkylamines, polyoxyethylene alkylamines, triethanolamine fatty acid esters and trialkylamine oxides; such anionic surfactants as fatty acid salts, abietic acid salts, hydroxyalkanesulfonic acid salts, alkanesulfonic acid salts, salts of dialkylsulfosuccinic acid esters, linear alkylbenzenesulfonic acid salts, branched alkylbenzenesulfonic acid salts, alkylnaphthalenesulfonic acid salts, alkylphenoxy polyoxyethylene propylsulfonic acid salts, salts of polyoxyethylene alkylsulfophenyl ethers, sodium N-methyl-N-oleyltaurines, disodium N alkylsulfosuccinic acid monoamides, petroleum sulfonic acid salts, sulfated castor oil, sulfated tallow, sulfuric acid ester salts of fatty acid alkyl esters, alkyl sulfate salts, polyoxyethylene alkyl ether sulfate salts, fatty acid monoglyceride sulfate salts, polyoxyethylene alkylphenyl ether sulfate salts, polyoxyethylene styrylphenyl ether sulfate salts, alkylphosphate salts, polyoxyethylene alkyl ether phosphate salts, polyoxyethylene alkylphenyl ether phosphate salts, partially saponified products of styrene-maleic anhydride copolymers, partially saponified products of olefin-maleic anhydride copolymers and naphthalenesulionate-formalin condensates; such cationic surfactants as alkylamine salts, quaternary ammonium salts, polyoxyethylene alkylamine salts and polyethylene-polyamine derivatives; such amphoteric surfactants as carboxy betaines, aminocarboxylic acids, sulfobetaines, aminosulfuric acid esters and imidazolines. The polyoxyethylene chains included in the surfactants listed above may be substituted with polyoxyalkylene such as polyoxymethylene, polyoxypropylene and polyoxybutylene chains and these surfactants may also be used in the invention. The same also applies to the following descriptions.

The surfactants listed above may be used alone or in combination and the amount thereof in the aqueous solution serving as a rinsing solution or the finisher used herein ranges from about 0.001 to about 10% by weight and preferably 0.01 to 5% by weight on the basis of the total weight of the aqueous solution.

The rinsing solution used in the invention may further comprise such antiseptics and/or anti-fungus agents as sorbic acid, ethyl p-oxybenzoate, oxybenzoate, phenol, formalin, dehydroacetic acid salts and 4-isothiazolin-3-one compound; and such anti oxidants a propyl gallate. 2,6-di-t-butyl-4-ethylphenol and 2,6-di-t-butyl-4-methylphenol. These antiseptics, anti fungus agents and anti-oxidants serving as preservatives can prevent deterioration or the like observed during storage of the aqueous solution by adding a small amount thereof, but the amount thereof preferably ranges from 0.001 to 5% by weight.

The rinsing solution used in the invention preferably contain a lipophilic substances. This makes image portions of the resultant lithographic printing plate highly ink receptive and the application of an ink [an emulsion type ink (usually black ink) is applied onto the images to make the images easily visible after development and to enhance and maintain the ink receptivity of the images] becomes easy. Moreover, when the lithographic printing plate is treated with plate-surface protecting agents after treating it with the foregoing aqueous solution, the lowering of the ink receptivity of the images can strongly be suppressed.

Preferred lipophilic substances are, for instance, organic carboxylic acids having 5 to 25 carbon atoms such as oleic acid, lauric acid, valeric acid, nonylic acid, caplic acid, myristic acid and palmitic acid; and castor oil. These lipophilic substances may be used alone or in combination. The amount of the lipophilic substances to be incorporated into the rinsing solution used herein ranges from 0.005 to about 10% by weight and preferably 0.05 to 5% by weight based on the total weight of the solution.

Further, the rinsing solution as used herein may preferably comprise an anti foaming agent such as organosilane compounds in an amount of 0.001 to 0.5% by weight.

In the present invention, if the finisher is a protective gumming solution containing water-soluble resins, it is preferred to add, to the protective gumming solution, surfactants, lipophilic substances, antiseptics, anti-fungus agents, antioxidants, anti-foaming agents and the like in addition to the acids and salts serving as pH-adjusting agents and buffering agents.

As the water-soluble resins which are principal component of the gumming solution, either of water-soluble natural polymers, semi-natural products (semi-synthetic materials) and synthetic polymers may be used.

Examples of natural polymers include starches such as sweet potato starch, potato starch, tapioca starch, wheat starch and corn starch; those obtained from algae such as carrageenan, laminaran, seaweed mannan, funori, irish moss, agar and sodium alginate; vegetable mucins such as tororo aoi mucin, mannan, quince-seed's mucin, pectin, tragacanth gum, karaya gum, xanthine gum, guar bean gum, locust bean gum, arabic gum, carobe gum and benzoin gum; microorganism's mucins such as homopolysaccharides, e.g., dextran, glucan and levan and heteropolysaccharides, e.g., succinoglucan and xanthane gum; and proteins such as glue, gelatin, casein and collagen.

Examples of semi-synthetic substances (semi-natural products) are alginic acid propylene glycol ester; cellulose derivatives such as viscose, methyl cellulose, ethyl cellulose, methyl ethyl cellulose, hydroxyethyl cellulose, carboxymethyl cellulose, hydroxypropyl cellulose, hydroxypropyl methyl cellulose, hydroxypropyl ethyl cellulose and hydroxypropyl methyl cellulose phthalate; and processed starches. Examples of processed starches include roasted starches such as white dextrin, yellow dextrin and British gum; enzyme modified dextrins such as enzyme dextrin and Schardinger dextrin; acid hydrolyzed starches such as solubilized starch; oxidized starches such as dialdehyde starch; pregelatinized starches such as modified $\alpha$-starch and unmodified $\alpha$-starch; esterified starches such as phosphated starch, fatty acid starch, sulfated starch, nitrated starch, xanthogenated starch and carbamic acid starch; etherified starches such as carboxyalkyl starch, hydroxyalkyl starch, sulfoalkyl starch, cyanoethyl starch, allyl starch, benzyl starch, carbamylethyl starch and dialkylaminostarch; cross-linked starches such as methylol cross-linked starch, hyroxyalkyl cross-linked starch, phosphoric acid cross-linked starch and dicarboxylic acid cross-linked starch; and starch graft copolymers such as starch-polyacrylamide copolymer, starch-polyacrylic acid copolymer, starch-polyvinyl acetate copolymer, starch-polyacrylonitrile copolymer, cationic starch-polyacrylate copolymer, cationic starch-vinylic polymer copolymer, starch-polystyrene-maleic acid copolymer and starch polyethylene oxide copolymer.

Examples of the synthetic polymers include polyvinyl alcohol and modified polyvinyl alcohol such as polyvinyl alcohol partially modified with acetal, allyl-modified polyvinyl alcohol, polyvinyl methyl ether, polyvinyl ethyl ether and polyvinyl isobutyl ether; polyacrylic acid or polymethacrylic acid derivatives such as sodium polyacrylate, partially saponified polyacrylate, partially saponified polyacrylic acid ester copolymer, salts of polymethacrylic acid and polyacrylamide; polyethylene 9lycol, polyethylene oxide, polyvinyl pyrrolidone, copolymer of vinyl pyrrolidone and vinyl acetate, carboxyvinyl polymer, styrol-maleic acid copolymer and styrol-crotonic acid copolymer. Among these, those derived from algae, vegetable mucins, cellulose derivatives, processed starches, propylene glycol alginate and synthetic polymers are suitably used in the invention because of their good film-forming properties on the resulting lithographic printing plates.

These water-soluble resins are used alone or in combination in the protective gumming aqueous solution and the amount thereof to be added preferably ranges from 1 to 40% by weight and more preferably 3 to 20% by weight. This is because if it is less than 1% by weight, the thickness of the film formed on the lithographic printing plate after drying is too small to serve as a protective gum. On the other hand, if it exceeds 40% by weight, the viscosity of the gumming solution becomes very high. Therefore, not only the circulation thereof becomes difficult but also the ink receptivity at the beginning of printing operations is impaired, which in turn leads to an increase in cost.

As lipophilic substances added to the protective gumming solution used in this invention there may be mentioned, for instance, high-boiling point organic solvents, fatty acids, fatty oils, monovalent alcohols, waxes as well as lipophilic resins used as a vehicle for ink for lithographic printing plates. Examples of preferred lipophilic resins include novolak type phenol resins such as phenol formaldehyde resin, cresol-formaldehyde resin and t-butylphenol-formaldehyde resin; xylene resins obtained by condensing phenol and xylene with formaldehyde; resins obtained by condensing phenol and mesitylene with formaldehyde, polyhydroxystyrene, brominated polyhydroxystyrene, cashew resins, partially esterified products of styrene-maleic anhydride copolymer, melamine resins, alkyd resins, polyester resins, epoxy resins, rosin, modified rosins such as hydrogenated rosin and rosin esters and petroleum resins such as gilsonite.

Examples of preferred high-boiling point organic solvents are phthalic acid diesters such as dibutyl phthalate, di-n-octyl phthalate. di-(2-ethylhexyl) phthalate, dinonyl phthalate, didecyl phthalate, dilauryl phthalate and butyl benzyl phthalate: dibasic fatty acid esters such as dioctyl azelate, dioctyl adipate, dibutyl glycol adipate, dibutyl sebacate, di-(2-ethylhexyl) sebacate and dioctyl sebacate; epoxidated triglycerides such as epoxidated soyabean oil; phosphoric acid esters such as tricresyl phosphate, trioctyl phosphate and trischloroethyl phosphate; and benzoic acid esters such as benzyl benzoate.

Examples of preferred fatty acids include saturated fatty acids such as caproic acid, enanthic acid, caprylic acid, pelargonic acid, capric acid, undecylic acid, lauric acid, tridecylic acid, myristic acid, pentadecylic acid, tridecylic acid, palmitic acid, heptadecylic acid, stearic acid, nonadecanoic acid, arachic acid, behenic acid, lignoceric acid, cerotic acid, heptacosanoic acid, montanic acid, melissic acid, lacceric acid and isovaleric acid; and unsaturated fatty acids such as acrylic acid, crotonic acid, isocrotonic acid, undecylenic acid, elaidic acid, cetoleic acid, erucic acid, brassidic acid, sorbic acid, linoleic acid, linolenic acid, arachidonic acid, propiolic acid, stearolic acid, clupanodonic acid, tariric acid and licanic acid.

Examples of monovalent alcohols are divided into the following groups: aliphatic saturated monovalent alcohols, aliphatic unsaturated monovalent alcohols, aromatic alcohOls, alicyclic alcohols and heterocyclic alcohols. The monovalent alcohols may have substituents and examples of such substituents are halogen atoms such as chlorine and bromine; alkoxy groups such as methoxy and ethoxy groups; and aryloxy groups such as phenoxy group.

These lipophilic substances are used alone or in combination in an amount preferably ranging from 0.01 to 10% by weight and more preferably 0.1 to 5% by weight on the basis of the total weight of the protective gumming solution. If the added amount of them is less than the lower limit of the foregoing range, desired improvement in the ink receptivity is not expected, while if it is more than the upper limit of the foregoing range, it is necessary to use a large amount of surfactants to solubilize or emulsify the lipophilic substances to thus obtain stable protective gumming solution and further the ability of desensitization with respect to non-image areas is deteriorated.

The same surfactants as those listed above in connection with the rinsing solution may also be suitably used in the protective gumming solution employed in this invention in the same amount as defined above.

The protective gumming solutions used herein may further comprise other additives such as antiseptics, anti-fungus agents, anti-oxidants and anti-foaming agents as those listed above associated with the rinsing solutions. These additives are used in the same amount as defined above in connection with the rinsing solution.

The protective gumming solutions used in the invention may be prepared in any forms such as emulsion type gumming solutions, suspension type gumming solutions and non-emulsion and non-suspension type gumming solutions by properly selecting the components such as surfactants and lipophilic substances to be incorporated thereinto, but preferably emulsion type and suspension type gumming solutions are employed from the viewpoint of their high ability of preventing the lowering of ink receptivity of image portions on the resulting lithographic printing plates. Moreover, the emulsion type gumming solutions make it possible to strongly suppress the generation of suspended materials in the plate-making method of this invention and to hence form only a small amount of insoluble matters.

In the present invention, it is preferred that the developer on the surface of the resulting lithographic printing plate after development be squeezed out as little as possible, whereby the contamination of the finisher by the developer is restricted to a very low level and the ability of processing of the rinsing solution is thus increased.

It is also preferred for enhancing processability of the finisher that a water washing process should lie between the developing process and the treatment with a finisher. The washing water used for this purpose is preierably used repeatedly to save the amount thereof and further the washing water can be used for a long time period by supplementing fresh water thereto. The amount of the developer and washing water remaining on the lithographic printing plate after squeezing out them is preferably not more than 20ml/m$^2$, more preferably not more than 10ml/m$^2$ and most preferably 5ml/m$^2$.

The treatment with a finisher in the invention may be performed according to various methods, for instance, a process comprising dipping a developed PS plate in a finisher; a process comprising coating a finisher onto a developed PS plate with a roller; or a process comprising injecting a finisher from a plurality of nozzles to a developed PS plate or a roller. In this respect, the amount of the finisher required for processing a PS plate can be greatly reduced. The amount of the finisher in the processing method in which the finisher is supplied onto the developed PS plate is preferably not less than 0.1 l/min and not more than 40 l/min and more preferably 3 to 20 l/min. Moreover, the method in which the degree of agitation of the finisher is enhanced on the lithographic printing plate such as those comprising injecting the finisher through a number of nozzles onto the developed PS plate is more preferred since substances adhered to or remaining on the developed and/or water washed PS plate can be washed away with the finisher and the finisher can be distributed uniformly throughout the surface of the processed plate.

According to a preferred embodiment of this invention, a replenisher is supplemented to a bath for treating the plate with the finisher. Such supplementation is performed to control the pH value of the rinsing solution to a desired value and to dilute concentrations of the components of the developer in the finisher thereby making the deposition of gel-like materials difficult. More specifically, the supplementation is performed depending on the quantity of the PS plates processed and preferably on areas of the PS plate to be processed. The amount of replenisher to be supplemented to the bath for finisher thus preferably ranges from 1 to 400 cc, more preferably 5 to 200 cc and most preferably 5 to 100 cc per 1 $m^2$ of the PS plate to be processed.

The replenisher used for this purpose may be a solution having the same composition and concentration as those of initially charged to the bath, a solution having the same composition but different in the degree of dilution from the initial one or a solution having a different composition.

The PS plates treated by the method of this invention are those comprising a substrate having lipophilic surfaces provided thereon with a light-sensitive layer containing a light-sensitive composition. Examples of such light-sensitive compositions include those containing diazo compounds; those containing azide compounds as disclosed in U.K. Patent Nos. 1,235,281 and 1,495,861; those containing photocross-linkable photopolymers as disclosed in U.S. Pat. No. 3,860,426; those comprising photopolymerizable photopolymers as disclosed in U.S Pat. Nos. 4,072,528 and 4,072,527; photo-conductive compositions as disclosed in J. P. KOKAI Nos. Sho 56-19063 and Sho 56-29250; and those comprising a silver halide emulsion as disclosed in J. P. KOKAI Nos. Sho 52-62501 and Sho 56-111852.

Among these light-sensitive compositions, preferably used are those comprising diazo compounds since they are synthetically excellent in properties such as storage property of the light-sensitive layer; developability, for instance, development latitude; image properties, e.g., quality of images; printing properties, e.g., ink receptivity and wear resistance; and low probability of causing environmental pollution due to the use of developers.

The light sensitive compositions containing diazo compounds can roughly be divided into two groups, i.e., negative-working type and positive-working type ones.

The negative-working light-sensitive compositions containing diazo compounds comprise light-sensitive diazo compounds and preferably polymeric compounds. As the light-sensitive diazo compounds there may be used any ones conventionally known and preferably used are salts of orgasmic solvent-soluble diazo resins such as salts of condensates of p-diazodiphenylamine and formaldehyde or acetaldehyde with hexafluorophosphates and salts of the condensates with 2hydroxy-4methoxybenzophneone-5-sulfonic acid salts.

Examples of the polymeric compounds are copolymers of acrylic acid or methacrylic acid; crotonic acid copolymers, itaconic acid copolymers, maleic acid copolymers, cellulose derivatives having carboxyl groups on the side chain thereof, polyvinyl alcohol derivatives having carboxyl groups on the side chain thereof, copolymers of hydroxyalkyl (meth)acrylate having carboxyl groups on the side chain thereof and unsaturated polyester resins having carboxyl groups.

As the diazo compounds used in the positive-working light-sensitive composition, any compounds conventionally known may be used and typical examples thereof include o-quinonediazides and preferably o-naphthoquinonediazide compounds. Particularly preferred are o-naphthoquinonediazidosulfonic acid esters or o-naphthoquinonediazido-carboxylic acid esters of various hydroxy compounds; and o-naphthoquinonediazidosulfonic acid amides or o-naphthoquinonediazido-carboxylic acid amides of various aromatic amine compounds. Preferred hydroxyl compounds are cOndensed resins of phenols and carbonyl group containing compounds. Examples of such phenols are phenol, cresol, resorcin and pyrogallol; examples of such carbonyl group-containing compounds are formaldehyde, benzaldehyde and acetone. Examples of preferred hydroxyl compounds include phenol-formaldehyde resins, cresol-formaldehyde resins, pyrogallol acetone resin and resorcin-benzaldehyde resins.

Typical examples of o-quinonediazide compounds include esters of benzoquinone-(1,2)-diazidosulfonic acid or naphthoquinone-(1,2)-diazidosulfonic acid and phenOl formaldehyde resin or cresol-formaldehyde resin; ester of naphthoquinone-(1,2)-diazido-(2)-5-sulfonic acid and resorcin-benzaldehyde resin as disclosed in J. P. KOKAI No. Sho 56-1044; ester of naphthoquinone-(1,2)-diazidosulfonic acid and pyrogallol acetone resin as disclosed in U.S. Pat. No. 3,635,709; and ester of naphthoquinone-(1,2)-diazido-(2)-5-sulfonic acid and resorcin-pyrogallol-acetone polycondensates as disclosed in J. P. KOKAI No. Sho 55-76346.

Examples of other useful o-quinonediazide compounds are polyesters having hydroxyl groups at their termini which are esteified with o-naphthoquinonediazidosulfonyl chloride as disclosed in J. P. KOKAI No. Sho 50-117503; homopolymers of p-hydroxystyrene or copolymers thereof with other copolymerizable monomers, which are esterified with o-naphthoquinonediazidosulfonyl chloride as disclosed in J. P. KOKAI No. Sho 50-113305; esters of bisphenol-formaldehyde resin and o-quinonediazidosulfonic acid as disclosed in J. P. KOKAI No. Sho 54-29922; condensates of alkyl acrylate-acryloyloxyalkyl carbonate-hydroxyalkyl acrylate copolymers with o-naphthoquinonediazidosulfonyl chloride as disclosed in U.S. Pat. No. 3,859,099; reaction products of copolymerized products of styrene and phenol derivatives with o-quinonediazidosulfonic acid as disclosed in Japanese Patent Publication for Opposition Purpose (hereunder referred to as "J. P. KOKOKU") No. Sho 49-17481; amides of copolymers of p-aminostyrene and other monomers copoly merizable therewith and o-naphthoquinonediazidosulfonic acid or o-naphthoquinonediazidocarboxylic acid as disclosed in U.S. Pat. No. 3,759,711; as well as ester compounds of polyhydroxybenzophenone and o-naphthoquinonediazidosulfonyl chloride.

These o-quinonediazide compounds may be used alone, but are preferably used as a mixture with an alkali-soluble resin to form a light-sensitive layer.

Preferred alkali-soluble resins include novolak type phenol resins and typical examples thereof are phenol-formaldehyde resin, cresol-formaldehyde resin and phenol-cresol-formaldehyde copolycondensed resins as disclosed in J. P. KOKAI No. Sho 55-57841. More preferably, the foregoing phenol resins are simultaneously used with a condensate of phenol or cresol substituted with an alkyl group having 3 to 8 carbon atoms with formaldehyde such as t-butylphenol-formaldehyde resin, as described in J. P. KOKAI No. Sho 50-125806.

Moreover, it is also possible to optionally incorporate, into the light-sensitive composition, alkali-soluble polymers other than the above listed alkali-soluble novolak type phenol resins. Examples of such polymers are styrene-acrylic acid copolymer, methyl methacrylate-methacrylic acid copolymer and alkali-soluble polyurethane resins; as well as alkali-soluble vinylic resins and alkali-soluble polybutyral resins as disclosed in J. P. KOKOKU No. Sho 52-28401.

The amount of the o-quinonediazide compounds preferably ranges from 5 to 80% by weight and more preferably 10 to 50% by weight based on the total weight of the solid contents of the light-sensitive composition. On the other hand, the amount of the alkali-soluble resins preferably ranges from 30 to 90% by weight and more preferably 50 to 85% by weight based on the total weight of the solid contents of the light sensitive composition.

The layer of the light-sensitive composition may be applied to a substrate for PS plates in the form of a multilayered structure. Moreover, the light-sensitive composition may further comprise optional components such as dyes, plasticizers and components for imparting print-out properties (ability of providing a visible image immediately after imagewise exposure).

The coated amount of the light-sensitive composition applied onto the surface of a substrate preferably ranges from 0.1 to 7 $g/m^2$ and more preferably 0.5 to 4 $g/m^2$.

It is also optionally possible to dispose an underlying coating between the substrate and the light sensitive layer, for instance, those composed of a metal salt and hydrophilic cellulose as disclosed in J. P. KOKOKU No. Sho 57-16349; a polyvinylsulfonic acid layer as disclosed in J. P. KOKOKU No. Sho 46-35685; a layer of $\beta$-alanine as disclosed in J. P. KOKAI No. Sho 60-149491; or a layer of triethanolamine hydrochloride a disclosed in J. P. KOKAI No. Sho 60-232998.

As substrates used in the PS plates processed by the method of this invention, preferred are aluminum (inclusive of aluminum alloys) plates, paper, plastic films such as polyethylene, polypropylene, polyethylene terephthalate, cellulose diacetate, cellulose triacetate. cellulose propionate, polyvinyl acetal and polycarbonate plates, and composite substrates composed of metal plates such as a copper or zinc plate which are laminated with an aluminum foil or on which an aluminum layer is deposited.

It is desirable that the surface of the substrate be generally subjected to surface roughening treatment for the purposes of enhancing its water retention property and improving the adhesion between the surface and the light-sensitive layer to be applied thereto.

As the surface roughening treatments, there may be mentioned such commonly known methods as brush graining, ball graining, electrolytic etching, chemical etching, liquid honing, sand blast and a combination thereof, preferably brush graining, electrolytic etching, chemical etching and liquid honing and, in particular, the surface roughening treatments which include electrolytic etching process. Electrolytic baths used in the electrolytic etching are aqueous solutions containing acids, alkalis or salts thereof, or those containing organic solvents. Particularly preferred are electrolytes containing hydrochloric acid, nitric acid or a salt thereof.

Furthermore, the aluminum plate which has been surface-roughened is optionally desmutted with an aqueous solution of an acid or an alkali. The aluminum plate thus obtained is preferably anodized. Particularly preferred method for anodization is to subject it to such treatments in a bath containing sulfuric acid or phosphoric acid. Moreover, the aluminum plate may be subjected to other surface treatments such as sealing treatment and dipping in an aqueous solution of potassium fluorozirconate.

The PS plates thus obtained are imagewise exposed, through an original transparency, to light from a light source rich in actinic rays such as a carbon arc lamp, a mercury lamp, a metal halide lamp, a tungsten lamp and a xenon lamp and are subsequently developed.

Developers used in the development processing of such PS plates may vary depending on the kinds of light-sensitive compositions used for making PS plates and the like, but those preferably used in the plate-making process of this invention contain at least one alkaline agents.

Examples of such alkaline agents include such silicates as sodium silicate, potassium silicate, lithium silicate and sodium metasilicate; such an inorganic alkaline agents as sodium hydroxide, potassium hydroxide, lithium hydroxide, ammonium hydroxide, sodium tertiary phosphate, sodium secondary phosphate, potassium tertiary phosphate, potassium secondary phosphate, ammonium tertiary phosphate, ammonium secondary phosphate, sodium bicarbonate, sodium carbonate, potassium carbonate and ammonium carbonate; and such organic amine compounds as mono-, di or triethanolamine, mono-, di or trimethylamine, mono-, di or triethylamine, mono- or diisopropylamine, n-butylamine, mono-, di or triisopropanolamine, ethyleneimine and ethylenediimine and preferably silicates, the use of which provides particularly remarkable effects of this invention. The amount of the silicate in the developer generally ranges from about 0.5 to 15% by weight, more preferably 1 to 10% by weight and most preferably 2 to 8% by weight on the basis of the total weight of the developer. Moreover, the molar ratio, $SiO_2/M_2O$ (wherein M represents an alkali metal atom or an ammonium residue), preferably ranges from 0.3 to 3.0

Methods for developing imagewise exposed PS plates with the foregoing developer may be any conventionally known ones. More specifically, there may be listed, for instance, a method comprising dipping the imagewise exposed PS plate in the developer; a method which comprises spraying the developer to the light sensitive layer of the PS plate through a plurality of nozzles; a method comprising wiping the light-sensitive layer with a sponge containing the developer; and a method comprising coating the developer onto the light-sensitive layer surface of the PS plate with a roller. In addition, the surface of the light sensitive layer may be lightly rubbed with, for instance, a brush after thus applying the developer onto the light-sensitive layer of the PS plate. The conditions of development can properly be selected depending on the selected method for development. For instance, the method for development by dipping is performed by dipping the exposed PS plate in the developer at a temperature ranging from about 10° to 35° C. for about 5 to 80 seconds.

The method of this invention makes it possible to prevent formation of gel-like or sludge-like insoluble matters in a bath for treatment with a finisher after development due to carrying over of the developer and to stably process a large quantity of lithographic printing plates over a long time period.

The present invention will hereunder be explained in more detail with reference to the following non-limitative working Examples. Moreover, the effects of the invention practically achieved will also be discussed in comparison with Comparative Examples.

EXAMPLE 1

An aluminum plate (1S) which had been grained was immersed in 2% by weight aqueous solution of sodium hydroxide maintained at 40° C. for one minute to etch the same. Then the plate was washed with water and was immersed in a sulfuric acid-chromic acid mixture for about one minute to expose pure aluminum surface. The plate was anodized at a DC voltage of 15 V and a current density of 2 A/dm$^2$ for 3 minutes in a 20% by weight sulfuric acid solution maintained at 30° C., was washed with water and was dried. A PS plate was prepared by applying a solution of the following light-sensitive composition on the aluminum plate thus treated so that the coated amount of the solution was 2 g/m$^2$ (weighed after drying).

| Component | Amount (g) |
| --- | --- |
| Naphthoquinone-1,2-diazido-(2)-5-sulfonic acid ester of acetone-pyrogallol resin (prepared by the method of Example 1 of U.S. Pat. No. 3,635,709) | 5 |
| t-Butylphenol-formaldehyde resin (PR-50530; available from SUMITOMO DUREZ CO., LTD.) | 0.5 |
| Cresol-formaldehyde resin (HITANOL #3110: available from Hitachi Chemical Co., Ltd.) | 5 |
| Methyl ethyl ketone | 50 |
| Cyclohexanone | 40 |

The positive-working PS plate thus prepared was imagewise exposed, through an original transparency, to light from a 3 KW metal halide lamp for 60 seconds.

Then the imagewise exposed PS plate was developed utilizing an automatic developing machine, a developer, washing water and a rinsing solution as explained below.

(1) Automatic Developing Machine

The developing machine comprises a developing bath and subsequent water washing and rinsing baths and is equipped with devices each of which circulates each processing solution in the order of a storage tank→a pump→a spray→a nozzle→ the storage tank and devices for supplementing each replenisher to the corresponding processing bath. Each storage tank for each processing bath is designed so that excess of each processing solution is discharged through overflow.

(2) Developer

A stock solution having the following composition was diluted 7 times with water and 21 l of the diluted solution was charged into the foregoing developing bath. pH thereof was 13.9.

| Component | Amount (g) |
| --- | --- |
| 40% aqueous solution of JIS No. 3 sodium silicate | 332 |
| Potassium hydroxide (48% by weight aqueous solution) | 191 |
| N-alkyl-N,N-dihydroxyethyl betaine amphoteric surfactant (36% by weight aqueous solution) | 3.2 |
| Pure water | 688 |

A replenisher having the following composition was diluted 5 times with water and it was supplemented by 50 ml for every additional PS plate having a size of 1003 mm × 800 mm.

| Component | Amount (g) |
| --- | --- |
| 40% aqueous solution of JIS No. 3 sodium silicate | 238 |
| Potassium hydroxide (48% by weight aqueous solution) | 328 |
| Pure water | 645 |

8 l of washing water (pH 1.5) having the following composition was charged to a water washing bath and 40 ml each of washing water was supplemented for every additional PS plate processed having a size of 1003 mm × 800 mm. The storage tank for the water washing bath is designed to cause overflow at a time when the level thereof exceeds 8 l.

| Component | Amount (g) |
| --- | --- |
| Sodium metasilicate | 10 |
| Pure water | 1000 |

(4) Rinsing Solution Containing Surfactants 8 l of a rinsing solution (pH about 6.0) obtained by diluting a stock solution for rinsing solution having the following composition 8 times with water was charged into a rinsing bath. Then the stock solution for rinsing solution wa diluted with water in various degrees of dilution to prepare replenishers for rinsing solutions A, B, C and D. Each replenisher for rinsing solution was supplemented in an amount of 40 ml each for every additional PS plates having a size of 1003 mm × 800 mm. The rinsing bath is also designed to cause overflow at a time when the level thereof exceeds 8 l.

| Component | Amount (g) |
| --- | --- |
| Sodium dodecyldiphenyl ether disulfonate (40% by weight aqueous solution) | 50 |
| Sodium dioctylsulfosuccinate | 20 |
| Phosphoric acid (85% by weight aqueous solution) | 50 |
| Sodium hydroxide | 20 |
| Silicon anti-foaming agent TSA-731 (made by Toshiba Silicon Co., Ltd.) | 0.1 |
| Pure water | 900 |

Under the foregoing conditions, the PS plates having a size of 003 mm × 800 mm were processed at a rate of 60 sheets per day for 3 months. As a result, when rinsing solutions C and D were used, water-insoluble sludge-like insoluble matters were generated as summarized in Table I, the insoluble matters caused clogging of nozzles of the spray, adhered to the surface of the resulting PS plate and this caused contamination of printed matters.

Contrary to this, rinsing solutions A and B did not cause generation of sludge-like insoluble matters and could stably treat the developed PS plates for over 3 months.

In this respect, the amount of the developer included in every rinsing solutions A to D was held to about 3.1% by volume by carrying over of the developer and the supplementation of each rinsing solution.

TABLE I

| Rinsing Soln. | Degree of Dilution of Stock Soln. of Rinsing Soln. | pH of Rinsing Bath After 2 Weeks* | Generation of Sludge-like Insoluble matter |
| --- | --- | --- | --- |
| A | 17 | 9.1 | — |

TABLE I-continued

| Rinsing Soln. | Degree of Dilution of Stock Soln. of Rinsing Soln. | pH of Rinsing Bath After 2 Weeks* | Generation of Sludge-like Insoluble matter |
|---|---|---|---|
| B | 14 | 7.8 | — |
| C | 11 | 7.3 | + |
| D | 8 | 7.1 | ++ |

Note(*): pH was gradually increased up to 2 weeks to thus reach values listed in Table I and thereafter they were approximately maintained at those values.
—: Not formed.
+: Formed.
++: A lot of sludge-like insoluble matters were formed.

EXAMPLE 2

The same treatment as in Example 1 except that a protective gumming solutions (5) containing the following water-soluble resins were substituted for the rinsing solutions containing surfactants (Example 1, Item (4)).

(5) Protective Gumming Solution Containing Water-soluble Resin

Protective gumming solutions E to I having the following compositions were prepared and 8 l each thereof was charged into the bath, used for the rinsing process, of the automatic developing machine used in Example 1.

| Component | Amount (g) |
|---|---|
| Gum arabic | 30 |
| Modified starch (available from NICHIDEN CHEMICAL CO., LTD. under the trade name of PENON JE-66) | 100 |
| Sodium hexametaphosphate | 2.5 |
| 40% Aqueous solution of sodium alkyl diphenyl ether disulfonate (available from SANYO CHEMICAL CO., LTD. under the trade name of SANDET BL) | 5 |
| Sodium dehydroacetate | 0.3 |
| Phosphoric acid (85% aqueous solution) | 2 | pH of the protective gumming solution E was 3.3. To the protective gumming solution E there was added 0.1 N sodium hydroxide solution to adjust pH to 4.0, 5.0, 6.5 and 8.0 to thus obtain protective gumming solutions F to I. 40 ml each of the protective gumming solutions was supplemented after processing each one lithographic printing plate having a size of 1003 mm × 800 mm as in Example 1. The processing was likewise continued for 3 months as in Example 1.

In this Example, the concentration of the developer in the protective gumming solution was maintained at 3.1% by volume in each of protective gumming solutions E to I during the first processing due to the carrying over of the developer and the supplementation of the protective gumming solution. On the other hand, during the second processing, that was 4.8% by volume since a lot of developer was carried over to the protective gumming solution because of the use of a roller having poor squeezing properties which had been recovered from the market, as a roller for the output of a water washing bath.

Moreover, when the protective gumming solution I was used, ink receptivity of image portions of the resulting lithographic printing plate was deteriorated during second processing, after continuing the processing for more than 2 weeks.

The results obtained are summarized in Table II given below.

TABLE II

| | | First Processing | | Second Processing | |
|---|---|---|---|---|---|
| Gumming Soln. | pH of Fresh Gumming Soln | pH after 2 weeks* | Generation of sludge-like insolubles | pH after 2 weeks* | Generation of sludge-like insolubles |
| E | 3.3 | 6.7 | ++ | 8.2 | + |
| F | 4.0 | 7.5 | + | 9.5 | — |
| G | 5.0 | 8.3 | — | 9.7 | — |
| H | 6.5 | 9.2 | — | 9.9 | — |
| I | 8.0 | 9.8 | — | 10.3 | — |

Note(*): pH of the gumming solutions was gradually increased up to 2 weeks to thus reach values listed in TABLE II and thereafter they were approximately maintained at those values.

Note(*): pH of the gumming solutions was gradually increased up to 2 weeks to thus reach values listed in Table II and thereafter they were approximately maintained at those values.

EXAMPLE 3

The same procedures as in Example 2 were repeated except that 10 g of hydroxy acetic acid was substituted for the phosphoric acid (85% aqueous solution) among the components of the protective gumming solution E. As a result, under a condition corresponding to the first processing (the concentration of the developer = 3.1% by volume), the initial pH was 2.8, it gradually increased up to 2 weeks, thereafter it was maintained at approximately 5.3, no sludge-like insoluble matters were formed and a stable processing could be continued over 3 months. In addition, under a condition corresponding to the second processing (the concentration of the developer = 4.8% by volume), the initial pH was 2.8, it gradually increased up to 2 weeks, thereafter it was maintained at approximately 6.0, but after about one month sludge-like insoluble matters were formed and the processing could not be continued any more.

What is claimed is:

1. A method for manufacturing lithographic printing plates which comprises:
   (1) developing a presensitized plate for use in making lithographic printing plates imagewise exposed to light with a developer;
   (2) treating the developed presensitized plate with a finisher utilizing an automatic developing machine; wherein the developer is an aqueous solution including 1 to 10% by weight of a silicate having a molar ratio of $SiO_2/M_2O$ (wherein M is an alkali metal or an ammonium group) ranging from 0.3 to 3.0, and the developer remaining on the developed plate is carried over and included in the finisher of the next finishing generation;
   wherein an initial pH of the finisher ranges from 2 to 8; and
   controlling a pH of the finisher during running to a value falling within the following pH range:
   $pH \geq 7 + \{(C - 2.5)/1.5\}^{\frac{1}{2}}$ or $pH \leq 7 - \{(C-2.5)/1.5\}^{\frac{1}{2}}$
wherein C is the concentration of the developer included in the finisher expressed in % by volume (C>2.5).

2. The method of claim 1 wherein the control of the pH of the finisher during running is performed by supplementing a fresh finisher.

3. The method of claim 1 wherein the finisher contains either a water soluble acid or a salt or both of them in an amount of not more than about 10% by weight expressed in the total amount of the acid and salt.

4. The method of claim 1 wherein the control of the pH of the finisher is performed by supplementing a solution containing either a water soluble acid or a salt or both of them.

5. The method of claim 1 wherein the finisher is a protective gumming solution containing at least one water-soluble resin or a rinsing solution containing at least one surfactant.

6. The method of claim 5 wherein the finisher is a rinsing solution containing at least one surfactant and the rinsing solution contains about 0.001 to about 10% by weight of the surfactant; 0.001 to 5% by weight of preservatives and agents for adjusting or buffering pH of the solution.

7. The method of claim 6 wherein the rinsing solution contains at least one lipophilic substance selected from the group consisting of organic carboxylic acids having 5 to 25 carbon atoms and castor oil in an amount of 0.005 to about 10% by weight based on the total weight of the rinsing solution.

8. The method of claim 5 wherein the finisher is a protective gumming solution containing a water-soluble resin and it comprises 1 to 40% by weight of the water-soluble resin; 0.01 to 10% by weight of a lipophilic substance; 0.001 to 5% by weight of preservatives; about 0.001 to about 10% by weight of the surfactant; and agents for adjusting or buffering pH of the solution.

9. The method of claim 1 wherein at least one water washing process lies between the development and the treatment with the finisher.

10. The method of claim 1 wherein the finisher is supplied onto the developed PS plate and the amount of the finisher is not less than 0.1/min and not more than 40/min.

11. The method of claim 1 wherein the finisher is supplemented in an amount ranging from 1 to 400 cc per 1 $m^2$ of the PS plate processed.

* * * * *